(12) United States Patent
Lee

(10) Patent No.: US 11,913,984 B2
(45) Date of Patent: Feb. 27, 2024

(54) DEVICE FOR TESTING INSULATION PROPERTIES OF TRANSFORMER

(71) Applicant: LS ELECTRIC CO., LTD., Anyang-si (KR)

(72) Inventor: Seung Wook Lee, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 287 days.

(21) Appl. No.: 17/442,672

(22) PCT Filed: Jul. 19, 2019

(86) PCT No.: PCT/KR2019/008976
§ 371 (c)(1),
(2) Date: Sep. 24, 2021

(87) PCT Pub. No.: WO2020/196994
PCT Pub. Date: Oct. 1, 2020

(65) Prior Publication Data
US 2022/0196721 A1    Jun. 23, 2022

(30) Foreign Application Priority Data
Mar. 26, 2019  (KR) .................. 10-2019-0034099

(51) Int. Cl.
*G01R 31/12* (2020.01)
*H01F 27/24* (2006.01)
(Continued)

(52) U.S. Cl.
CPC ......... *G01R 31/1227* (2013.01); *H01F 27/24* (2013.01); *H01F 27/29* (2013.01); *H01F 27/36* (2013.01)

(58) Field of Classification Search
CPC .................................................. G01R 21/1227
(Continued)

(56) References Cited

U.S. PATENT DOCUMENTS 3,659,239 A * 4/1972 Marton ................... H01F 27/22
336/60

FOREIGN PATENT DOCUMENTS

CN        108414876 A    8/2018
JP      2011233557 A    11/2011
(Continued)

OTHER PUBLICATIONS

International Search Report for related International Application No. PCT/KR2019/008976; action dated Oct. 1, 2020; (5 pages).
(Continued)

*Primary Examiner* — Vincent Q Nguyen
(74) *Attorney, Agent, or Firm* — K&L Gates LLP

(57) ABSTRACT

A device for testing insulation properties of a transformer may be provided by: a low-voltage winding part and a high-voltage winding part that are arranged concentrically with each other; an iron core for testing combined with the low-voltage winding part and the high-voltage winding part and adjustable in height according to the height of low-voltage winding part and the high-voltage winding part; a low-voltage terminal part connected to both ends of the winding of the low-voltage winding part; and a high-voltage terminal part connected to both ends of the winding of the high-voltage winding part.

17 Claims, 6 Drawing Sheets

(51) Int. Cl.
   *H01F 27/36*  (2006.01)
   *H01F 27/29*  (2006.01)
(58) Field of Classification Search
   USPC .......................................... 324/551, 546–547
   See application file for complete search history.

(56) References Cited

FOREIGN PATENT DOCUMENTS

| | | |
|---|---|---|
| JP | 2012114165 A | 6/2012 |
| JP | 2014165406 A | 9/2014 |
| JP | 2016063151 A | 4/2016 |
| KR | 101520476 B1 | 5/2015 |

OTHER PUBLICATIONS

Written Opinion for related International Application No. PCT/KR2019/008976; action dated Oct. 1, 2020; (4 pages).

* cited by examiner

DEVICE FOR TESTING INSULATION PROPERTIES OF TRANSFORMER

CROSS-REFERENCE TO RELATED APPLICATIONS

The present application is a National Stage of International Application No. PCT/KR2019/008976 filed on Jul. 19, 2019, which claims the benefit of Korean Patent Application No. 10-2019-0034099, filed on Mar. 26, 2019, with the Korean Intellectual Property Office, the entire contents of each hereby incorporated by reference.

FIELD

The present disclosure relates to a device for testing insulation properties of a transformer, and more specifically, to a device for testing insulation properties of a transformer capable of testing a winding part insulation property during a transformer manufacturing process.

BACKGROUND

Recently, a topic in transformer development is high efficiency and light weight. In order to reduce a weight in a state in which copper, mineral oil, and carbon steel, which are the main materials used in a transformer, are not changed, it is necessary to increase a usage amount of the main materials or reduce an insulation distance. Specifically, reducing the insulation distance for weight reduction causes deterioration of insulation properties.

Transformer tests include a basic test, an insulation test, a property test, a control panel test, and other tests. The insulation test, which is one of the most important tests in the property test, tests items related to safety of the transformer including a lightning impulse, a switching impulse, a commercial frequency withstand voltage test, an induced withstand voltage test, and a partial discharge test.

A conventional device for testing insulation properties is formed after manufacturing a transformer is completed. That is, the insulation properties are tested after respectively manufacturing a winding part and an iron core, assembling the winding part and the iron core with each other, and vacuum drying and assembling in a box.

An ultra-high voltage transformer takes a period of approximately 3 to 6 months to produce depending on the specifications.

In the case in which the insulation property test of the transformer is performed after the transformer is manufactured like the related art, a design should be changed again when the transformer does not pass the insulation property test.

Accordingly, since the ultra-high voltage transformer should be manufactured by repeating the manufacturing process until the transformer passes the insulation property test, there was a big problem in cost and time loss.

In order to solve this problem, accordingly, transformer manufacturers secure insulation standards through insulation analysis techniques or insulation material tests using computer aided engineering (CAE) in order to improve the consistency of an insulation design, and invest many resources to derive measures for insulation reinforcement.

However, this method also has the disadvantage that it is impossible to check the insulation problem in advance during the manufacturing process, and the insulation problem can be checked through a test after manufacturing.

Specifically, since recent transformers require a more compact insulation design for high efficiency and light weight, the frequency of insulation accidents is increasing.

In the existing manufacturing process, an insulation check is provided to measure an insulation thickness and an insulation distance according to the design, and thus manufacturing errors can be reduced, but design errors cannot be reduced.

Further, since the test using a sample does not reflect a potential oscillation phenomenon due to a capacitance between a transformer winding and the iron core, there was a problem in that soundness of the insulation design could not be confirmed.

SUMMARY

An object to be solved by the present disclosure in consideration of the above problems is to provide a device for testing insulation properties capable of testing insulation properties during a manufacturing process of a transformer.

Further, another object of the present disclosure is to provide a device for testing insulation properties applicable to various sizes of a winding part.

One aspect of the present disclosure provides a device for testing insulation properties of a transformer, including: a low-voltage winding part and a high-voltage winding part arranged concentrically with each other; an iron core for testing combined with the low-voltage winding part and the high-voltage winding part and adjustable in height according to heights of low-voltage winding part and high-voltage winding part; a low-voltage terminal part connected to both ends of a winding of the low-voltage winding part; and a high-voltage terminal part connected to both ends of a winding of the high-voltage winding part.

In an embodiment of the present disclosure, the device may further include an iron core shield part located between a center iron core of the iron core for testing and the low-voltage winding part to adjust an interval with the low-voltage winding part.

In the embodiment of the present disclosure, the iron core shield part may include an inner insulating part arranged at a circumference of the center iron core, a shield part located at an outer surface of the inner insulating part, an outer insulating part surrounding the shield part, and a bus bar for electrical connection between the shield part and the iron core for testing.

In the embodiment of the present disclosure, the shield part may include metal bars which are vertically elongated, and a diameter of the shield part may be adjusted by adjusting the number of metal bars.

In the embodiment of the present disclosure, the iron core for testing may be divided into an upper yoke and a lower yoke, and may include a height adjustment part capable of adjusting a height between the upper yoke and the lower yoke.

In the embodiment of the present disclosure, the height adjustment part may have a structure vertically divided into a plurality of parts, and a height of the iron core for testing may be adjusted according to a usage amount of the divided height adjustment parts.

In the embodiment of the present disclosure, the upper yoke and the height adjustment part, and the height adjustment part and the lower yoke may be combined with each other by concavo-convex structures.

In the present disclosure, there is an effect in that manufacturing costs and time of a transformer can be reduced even when the transformer does not pass an insulation property test by allowing the insulation property test of the transformer to be performed during a transformer manufacturing process.

More specifically, in the present disclosure, there is an effect in that an insulation property test in which a potential oscillation phenomenon due to a capacitance between a winding part and an iron core is reflected can be performed by allowing the insulation property test to be performed in a state in which the iron core for testing and the winding part are combined after the iron core for testing is separately manufactured to manufacture the winding part.

Further, in the present disclosure, there is an effect in that an insulation property test for a winding part of various design specifications can be performed by applying an easily changed iron core structure to meet the design specifications of the winding part and applying a shield part capable of adjusting an interval between the iron core and the winding part.

REFERENCE NUMERALS

| | |
|---|---|
| 100: iron core for testing | 110: upper yoke |
| 120: lower yoke | 130: height adjustment part |
| 200: low-voltage winding part | 300: high-voltage winding part |
| 400: center iron core | 500: guide iron core |
| 600: iron core shield part | 610: inner insulating part |
| 620: shield part | 630: outer insulating part |
| 640: bus bar | |

DETAILED DESCRIPTION

In order to fully understand configurations and effects of the present disclosure, exemplary embodiments of the present disclosure will be described with reference to the accompanying drawings. However, the present disclosure is not limited to the embodiments which will be described below, and may be implemented in various forms and various modifications may be made. However, the description of the embodiments is provided so that the present disclosure is completely described, and is provided to fully inform the scope of the present disclosure to those skilled in the art. In the accompanying drawings, components are enlarged in size from reality for convenience of description, and a ratio of each component may be exaggerated or reduced.

Terms such as 'first' and 'second' may be used to describe various elements, but the elements should not be limited by the above terms. The above terms may be used only for the purpose of distinguishing one component from another. For example, without departing from the scope of the present disclosure, a 'first component' may be referred to as a 'second component', and similarly, a 'second component' may also be referred to as a 'first component'. Further, a singular form includes a plural form unless otherwise differently expressed. Unless otherwise defined, the terms used in the embodiments of the present disclosure may be interpreted as meanings commonly known to those skilled in the art.

Hereinafter, a device for testing insulation properties of a transformer according to one embodiment of the present disclosure will be described in detail with reference to the drawings.

Figure 1:
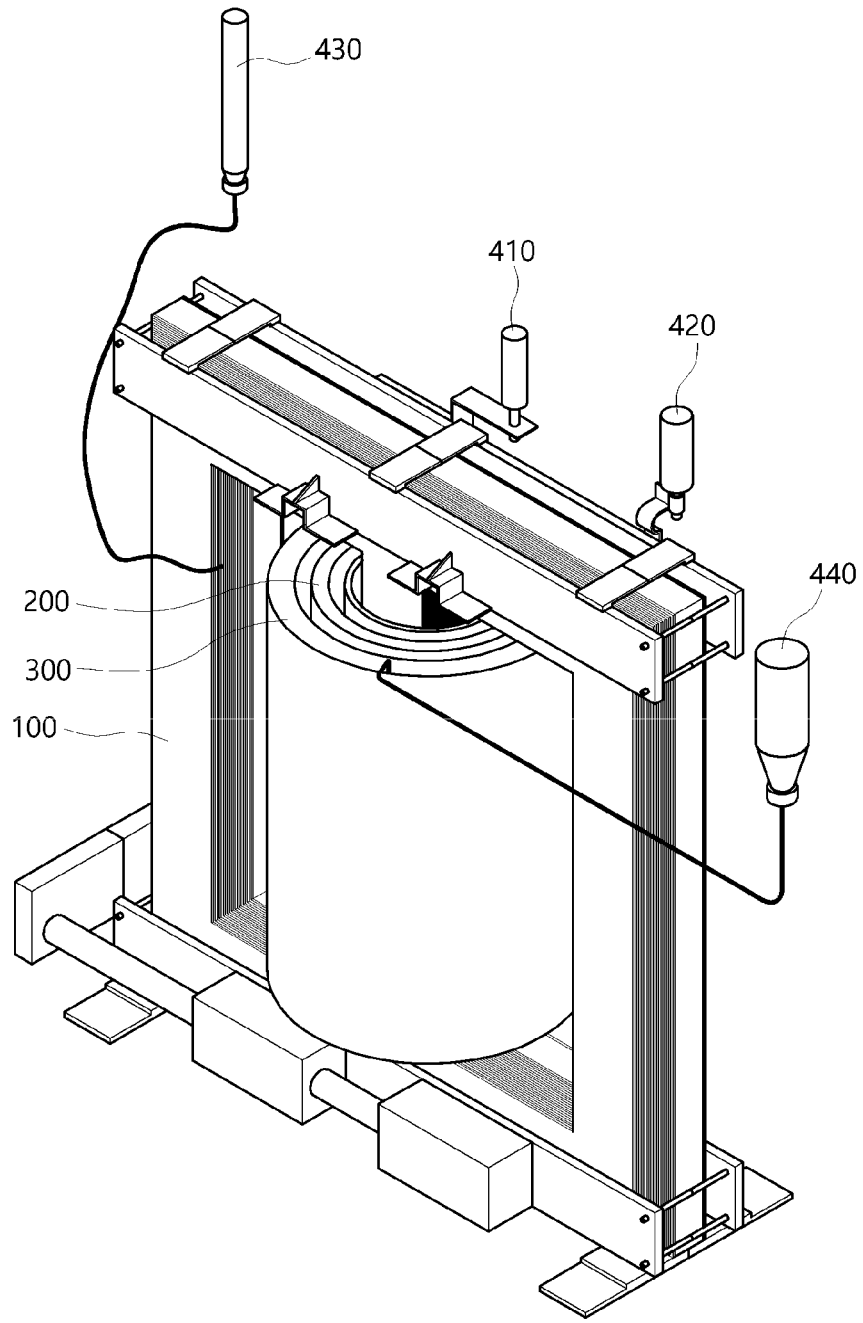
FIG. 1 is a configuration diagram of a device for testing insulation properties of a transformer according to an exemplary embodiment of the present disclosure.

FIG. 1 is a configuration diagram of a device for testing insulation properties of a transformer according to an exemplary embodiment of the present disclosure.

Referring to FIG. 1, the device for testing insulation properties of a transformer according to the exemplary embodiment of the present disclosure includes a low-voltage winding part 200 and a high-voltage winding part 300 arranged concentrically with each other, an iron core for testing 100 combined with the low-voltage winding part 200 and the high-voltage winding part 300, and adjustable in height according to heights of the low-voltage winding part 200 and high-voltage winding part 300, low-voltage terminal parts 410 and 420 connected to both ends of a winding of the low-voltage winding part 200, and high-voltage terminal parts 430 and 440 connected to both ends of a winding of the high-voltage winding part 300.

Each of the low-voltage winding part 200 and the high-voltage winding part 300 have a cylindrical shape as a whole on which a coil is wound, and the high-voltage winding part 300 and the low-voltage winding part 200 may be a primary side and a secondary side of the transformer, respectively, or conversely, may be a secondary side and a primary side, respectively.

Like the above, terminal parts for supplying current or drawing induced current are respectively formed on the high-voltage winding part 300 and the low-voltage winding part 200. That is, the low-voltage terminal parts 410 and 420 are connected to both ends of the low-voltage winding part 200, and the high-voltage terminal parts 430 and 440 are connected to both ends of the high-voltage winding part 300.

Figure 2:
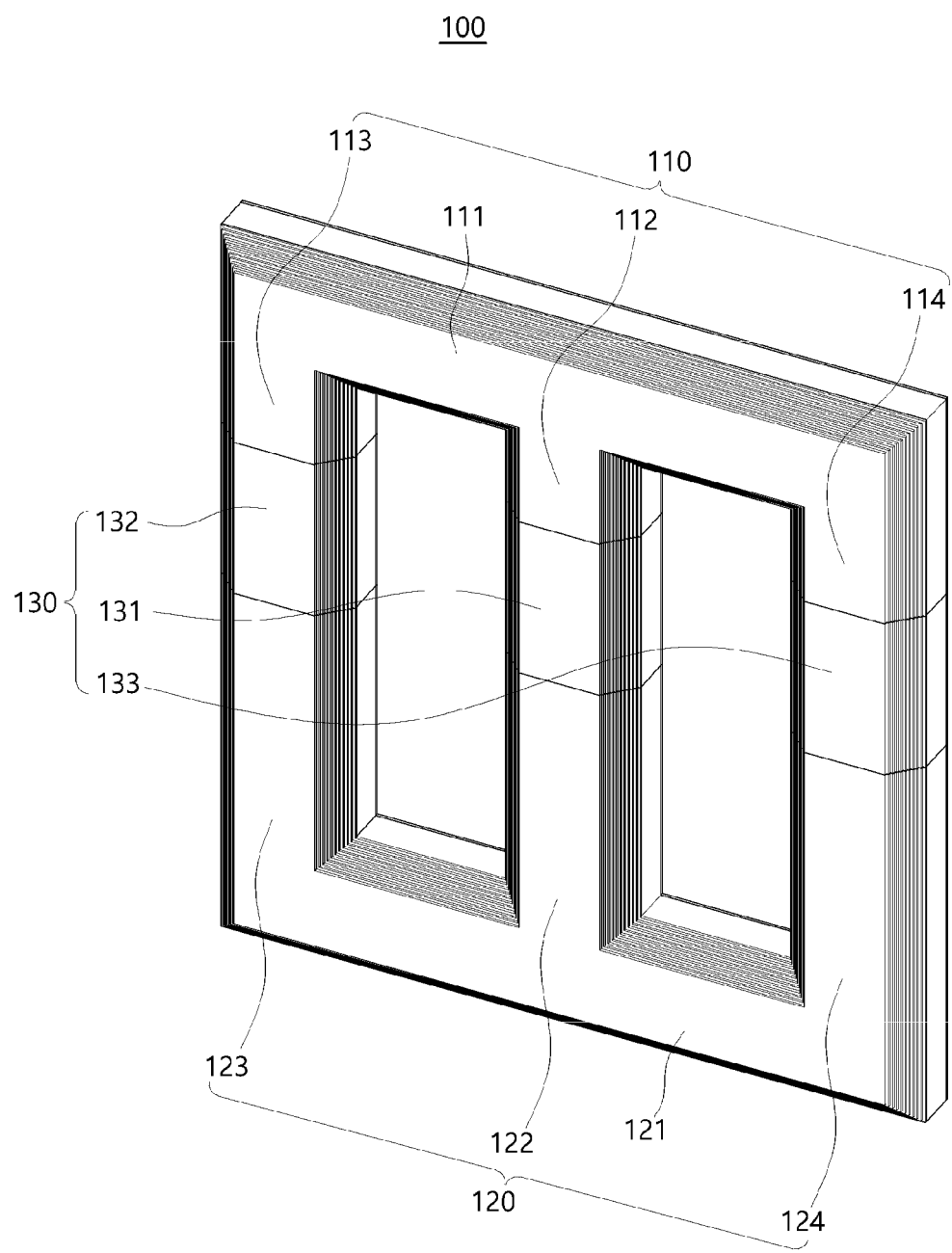
FIG. 2 is a configuration diagram of a combined state of an iron core for testing of the device for testing insulation properties of a transformer according to an exemplary embodiment of the present disclosure.
Figure 3:
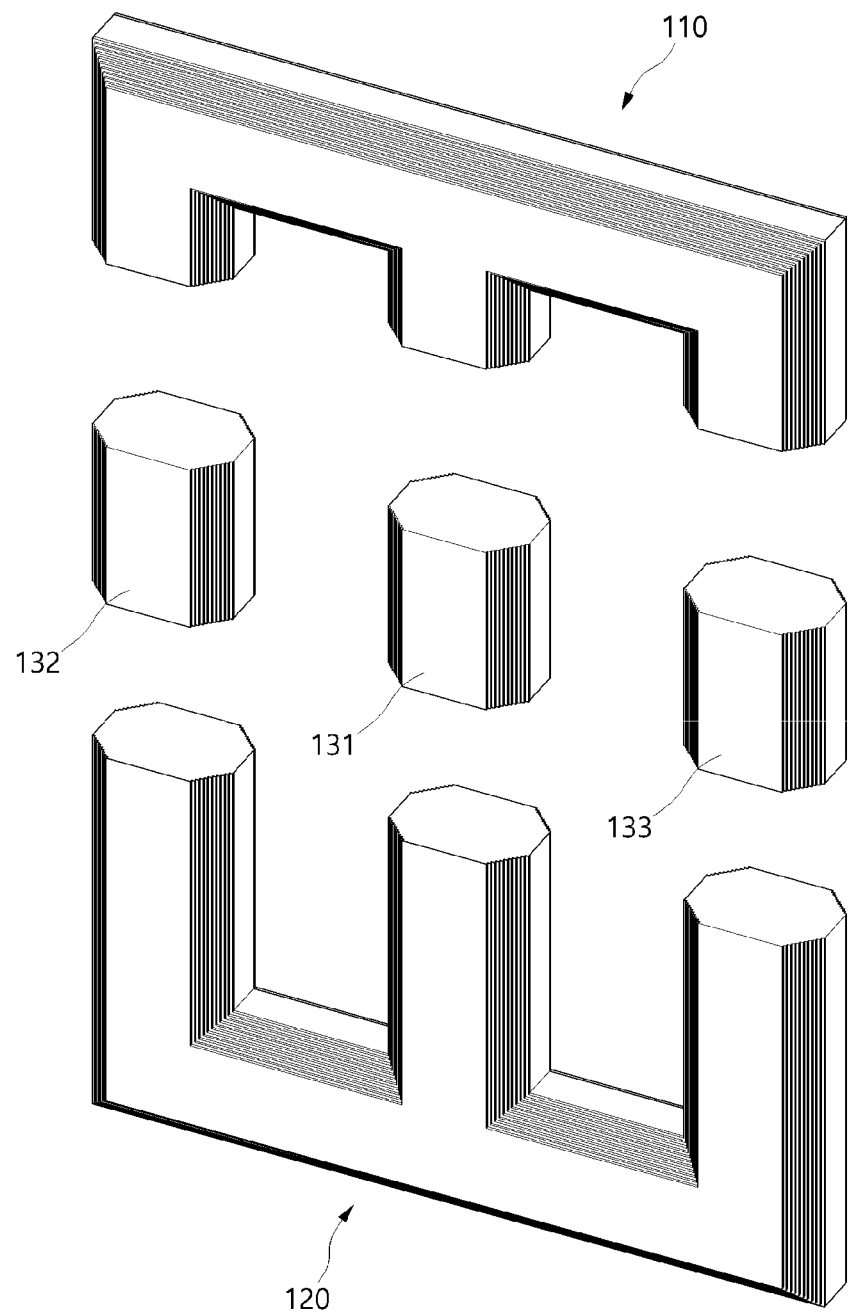
FIG. 3 is an exploded perspective view of FIG. 2.

FIG. 2 is a configuration diagram of a combined state of the iron core for testing of the device for testing insulation properties of a transformer according to an exemplary embodiment of the present disclosure, and FIG. 3 is an exploded perspective view of FIG. 2.

Referring to FIGS. 2 and 3, the iron core for testing 100 of the present disclosure includes an upper yoke 110, a lower yoke 120, and a height adjustment part 130 which connects the upper yoke 110 and the lower yoke 120, and is adjustable in height.

The upper yoke 110 may have, for example, protrusions protruding downward from a center and both side ends of a horizontal substrate, and specifically, may include a first horizontal substrate 111 which is horizontal to the ground, a first center iron core 112 extending downward from a center portion of the first horizontal substrate 111, and guide iron cores 113 and 114 extending downward from both side ends of the first horizontal substrate 111.

Like the above, the lower yoke 120 includes a second horizontal substrate 121 which is horizontal to the ground, a second center iron core 122 extending upward from a center of the second horizontal substrate 121, and guide iron cores 123 and 124 extending upward from both side ends of the second horizontal substrate 121.

The first center iron core 112 and the second center iron core 122 correspond to concentric axes of the low-voltage winding part 200 and the high-voltage winding part 300. That is, the first center iron core 112 and the second center iron core 122 are located at an inner center of the low-voltage winding part 200 having a cylindrical structure.

The height adjustment part 130 includes a third center iron core 131 which connects between the first center iron core 112 and the second center iron core 122, and guide iron cores 132 and 133 which vertically connect between the guide iron cores 113 and 114 of the upper yoke 110 and the guide iron cores 123 and 124 of the lower yoke 120, respectively.

The third center iron core 131 and the guide iron cores 132 and 133 may be provided in a structure vertically divided into a plurality of parts. That is, the third center iron core 131 and the guide iron cores 132 and 133 are formed by combining a plurality of structures which are vertically arranged, and a height of the entire iron core for testing 100 may be adjusted by adjusting the number of structures.

Adjustment of the height of the iron core for testing 100 like the above is provided to correspond to a height among design specifications of the low-voltage winding part 200 and the high-voltage winding part 300, and the height of the iron core for testing 100 may be adjusted to match the heights of the low-voltage winding part 200 and the high-voltage winding part 300.

Accordingly, in the present disclosure, it is assumed that an insulation test is performed using the iron core for testing 100 after manufacturing the low-voltage winding part 200 and the high-voltage winding part 300 and before manufacturing a formal iron core.

Specifically, the iron core for testing 100 is divided into the upper yoke 110, the lower yoke 120, and the height adjustment part 130, and the manufactured low-voltage winding part 200 and high-voltage winding part 300 are located on the lower yoke 120 in a state in which the second center iron core 122 is inserted into a center of the low-voltage winding part 200.

Next, the third center iron core 131 and the guide iron cores 132 and 133 constituting the height adjustment part 130 are mounted on the lower yoke 120 to match the heights of the low-voltage winding part 200 and the high-voltage winding part 300, and finally, the upper yoke 110 is covered to form a structure of a test device capable of performing the insulation test shown in FIG. 1.

Figure 4:
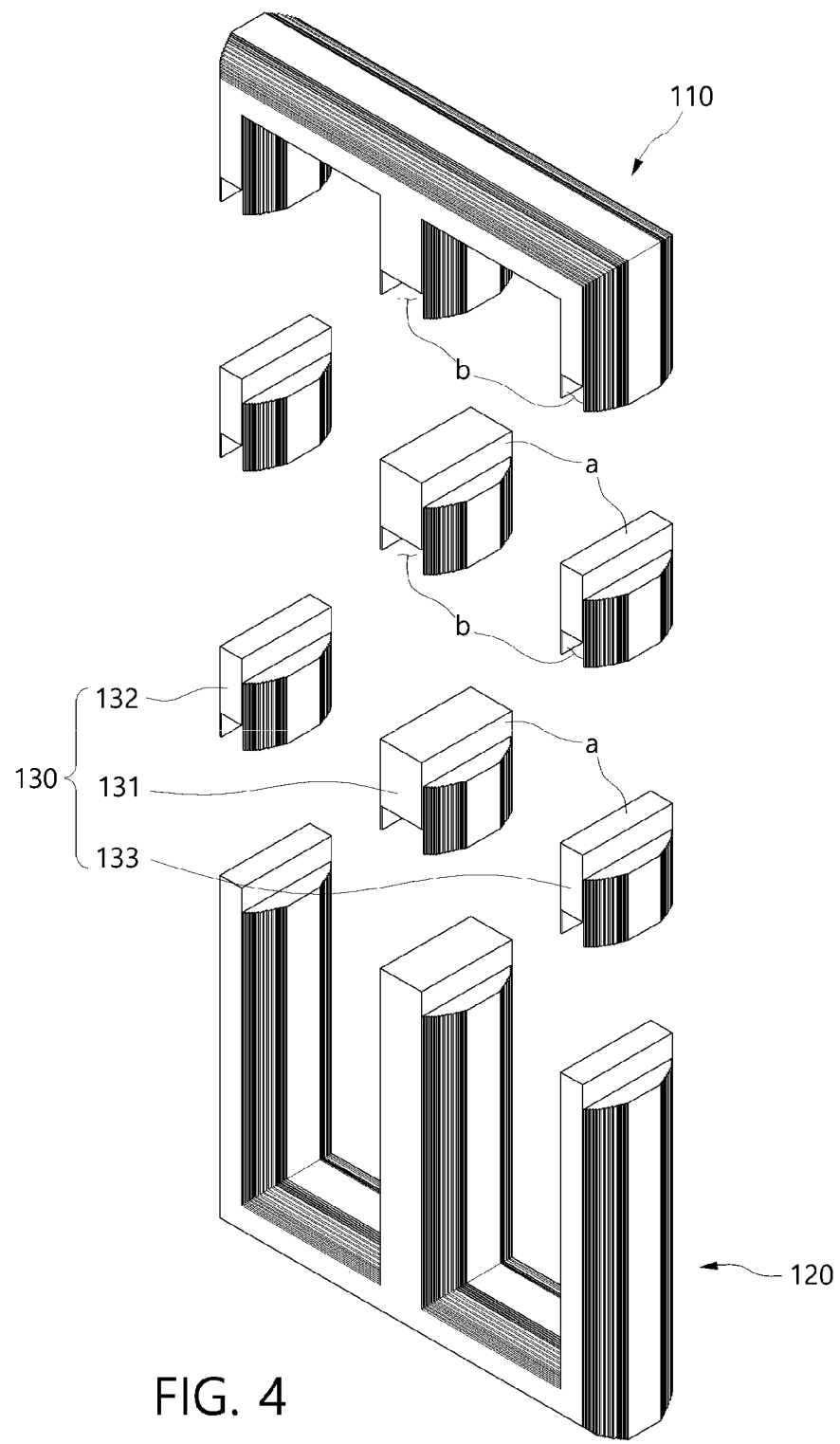
FIG. 4 is an exploded perspective view of the iron core for testing applied to the present disclosure.

FIG. 4 is a configuration diagram of an iron core for testing according to another embodiment of the present disclosure.

Referring to FIG. 4, the iron core for testing according to another embodiment of the present disclosure includes an upper yoke 110, a lower yoke 120, and a height adjustment part 130.

As described above, the height adjustment part 130 includes a third center iron core 131 and guide iron cores 132 and 133 having a structure vertically divided into a plurality of parts.

The height adjustment part 130 has an upper portion which comes into contact with the upper yoke 110, and a lower portion which comes into contact with the lower yoke 120, and thus may provide a structure physically combined with an opposite surface by a concave-convex structure for solid combination.

That is, concave grooves (b) are formed in a contact surface of the height adjustment part 130 of the upper yoke 110, and protrusions (a) inserted into the concave grooves (b) are formed on the third center iron core 131 and the guide iron cores 132 and 133 of the height adjustment part 130 and thus mutual stable combination may be performed.

Likewise, the concave grooves (b) are formed in surfaces the guide iron cores 132 and 133 and the third center iron core 131 of the height adjustment part 130 which come into contact with the lower yoke 120 to provide a structure which may be combined with the protrusions (a) of the lower yoke 120.

Like the above, in the present disclosure, the manufactured low-voltage winding part 200 and high-voltage winding part 300 may be easily mounted by dividing the iron core for testing 100 into a structure of the upper yoke 110, the height adjustment part 130, and the lower yoke 120, and in a state in which the low-voltage winding part 200 and the high-voltage winding part 300 are mounted, combination stability of the divided iron core for testing 100 may be increased to secure stability of the test by preventing the occurrence of movement during the insulation test.

As described above, in the present disclosure, the insulation test may be performed regardless of the heights of the low-voltage winding part 200 and the high-voltage winding part 300 which are previously manufactured by providing the divided iron core for testing 100.

In the insulation test, when the insulation properties of the low-voltage winding part 200 and the high-voltage winding part 300 do not meet required values, the low-voltage winding part 200 and the high-voltage winding part 300 should be manufactured again after changing designs of the low-voltage winding part 200 and the high-voltage winding part 300.

In this case, unlike the related art, since there is no need to change a design of the iron core, costs and time consumption may be reduced.

Further, in the present disclosure, in order to maintain an accurate distance between the iron core and the winding part, an iron core shield part capable of maintaining an interval between the iron core for testing and the low-voltage winding part may be further included.

Figure 5:
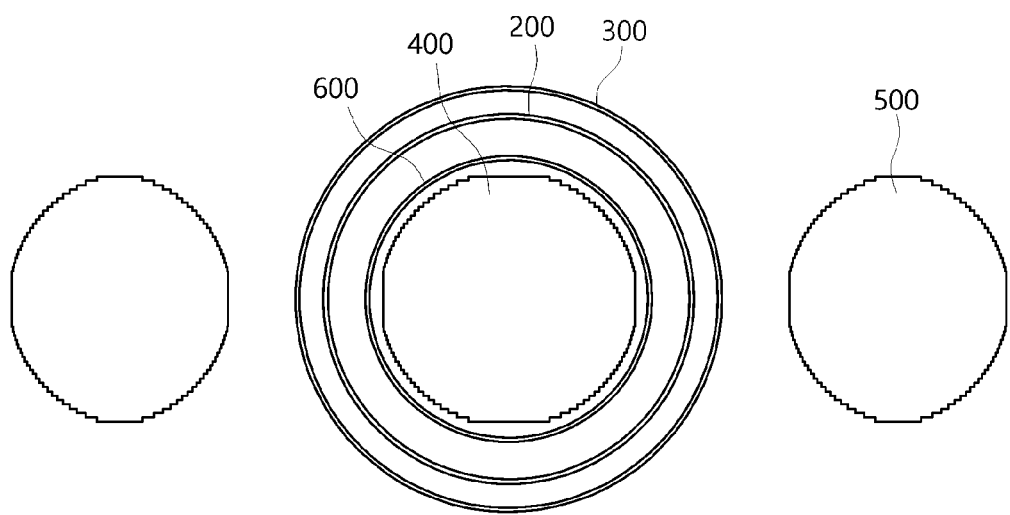
FIG. 5 is an exemplary view for describing an iron core shield part.

FIG. 5 is an exemplary view for describing a concept of the iron core shield part.

Referring to FIG. 5, the iron core for testing 100 applied to the present disclosure includes a center iron core 400 and guide iron cores 500 located at positions symmetrical to each other with the center iron core 400 interposed therebetween.

In this case, the center iron core 400 may be understood as a combination of the above-described first to third center iron cores 112, 122, and 131, and the guide iron cores 500 should be understood as a structure in which the guide iron cores 113 and 114 of the upper yoke 110, the guide iron cores 123 and 124 of the lower yoke 120, and the guide iron cores 132 and 133 of the height adjustment part 130 are stacked.

The low-voltage winding part 200 and the high-voltage winding part 300 are combined around the center iron core 400. In this case, low-voltage winding part 200 and the high-voltage winding part 300 each have a cylindrical structure, and diameters thereof are determined by a design.

However, the height of the iron core for testing 100 applied to the present disclosure may be adjusted due to application of the height adjustment part 130, but since there is no means which adjusts a diameter of the center iron core 400, there is a feature in that it is difficult for regularly maintaining an interval between the center iron core 400 and the low-voltage winding part 200.

In order to compensate for this, an iron core shield part 600 may be further included between the center iron core 400 and the low-voltage winding part 200.

Figure 6:
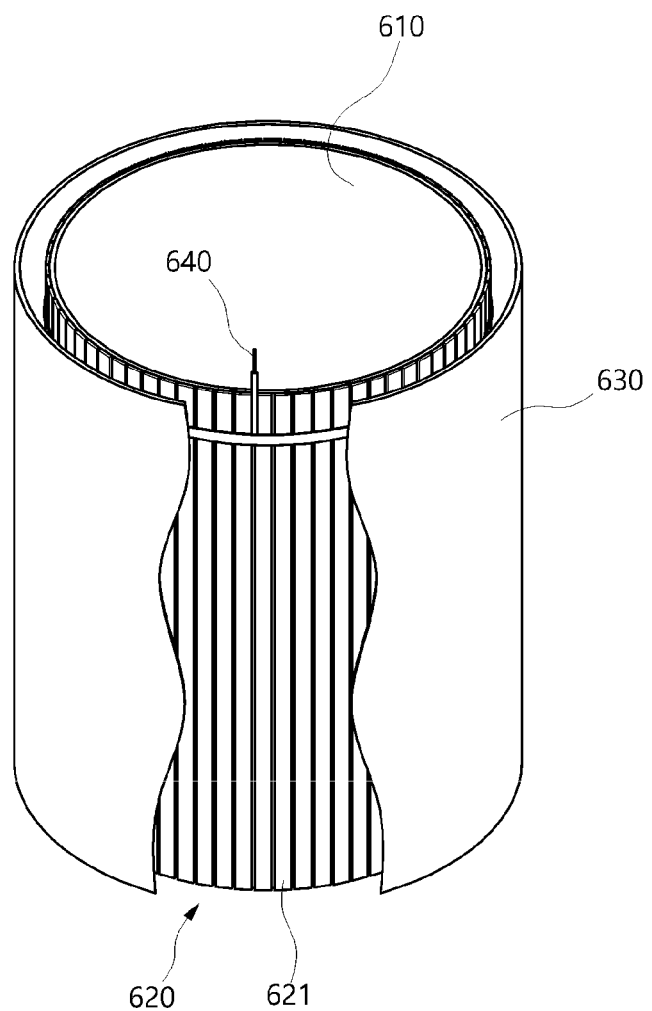
FIG. 6 is a configuration diagram of an example of the iron core shield part.

FIG. 6 is a partially cut-away perspective view of the iron core shield part 600.

Referring to FIG. 6, the iron core shield part 600 includes a cylindrical-shaped inner insulating part 610 spaced apart from a circumference of the center iron core 400 by a predetermined distance, a shield part 620 including a plurality of metal bars 621 installed on an outer surface of the inner insulating part 610, an outer insulating part 630 which covers an outer surface of the shield part 620, and a bus bar 640 for electrical connection of the shield part 620 and the center iron core 400.

The inner insulating part 610 and the outer insulating part 630 are used by rolling a plate-shaped structure into a cylindrical shape, and accordingly, diameters may be adjusted.

Further, in the shield part 620, the diameter may also be adjusted by adjusting the number of metal bars 621 by combining the metal bars 621 in a vertical direction.

Like the above, as shown in FIG. 5, the diameter of the cylindrical-shaped iron core shield part 600 installed between the center iron core 400 and the low-voltage winding part 200 may be adjusted.

Accordingly, the interval between the iron core shield part 600 and the low-voltage winding part 200 may be regularly adjusted and maintained.

Further, the bus bar 640 is connected to the shield part 620 of the iron core shield part 600, and the bus bar 640 is electrically connected to the iron core for testing 100.

Accordingly, the present disclosure has an effect of substantially expanding the diameter of the center iron core 400, and may maintain a regular interval corresponding to the diameter of the low-voltage winding part 200, and thus the reliability of the insulation test can be improved.

In the above, although the embodiments according to the present disclosure have been described, these are merely exemplary, and those skilled in the art will understand that various modifications and equivalents of embodiments may be performed. Accordingly, the true technical scope of the present disclosure should be defined by the following claims.

The present disclosure has industrial applicability as a technology related to a device for testing insulation properties of a transformer which is reusable and adjustable in size using natural laws.

The invention claimed is:

1. A device for testing insulation properties of a transformer, comprising:
    a low-voltage winding part and a high-voltage winding part arranged concentrically with each other, with the low-voltage winding part
    an iron core for testing combined with the low-voltage winding part and the high-voltage winding part, and adjustable in height according to heights of low-voltage winding part and high-voltage winding part, wherein the low-voltage winding part is arranged concentrically around a center iron core of the iron core for testing and the high-voltage winding part is arranged concentrically around the low-voltage winding part;
    a low-voltage terminal part connected to both ends of a winding of the low-voltage winding part;
    a high-voltage terminal part connected to both ends of a winding of the high-voltage winding part, and
    an iron core shield part located between the center iron core of the iron core for testing and the low-voltage winding part to adjust a spacing interval between the low-voltage winding part and the center iron core, wherein the iron core shield part includes an inner insulating part arranged at a circumference of the center iron core, a shield part located at an outer surface of the inner insulating part, an outer insulating part surrounding the shield part, and a bus bar for electrical connection between the shield part and the iron core for testing.

2. The device of claim 1, wherein the shield part includes metal bars which are vertically elongated, and a diameter of the shield part is adjusted by adjusting the number of metal bars.

3. The device of claim 1, wherein the iron core for testing is divided into an upper yoke and a lower yoke, and includes a height adjustment part capable of adjusting a height between the upper yoke and the lower yoke.

4. The device of claim 3, wherein:
    the height adjustment part has a structure vertically divided into a plurality of parts; and
    a height of the iron core for testing is adjustable according to a usage amount of the divided height adjustment parts.

5. The device of claim 4, wherein the upper yoke and the height adjustment part, and the height adjustment part and the lower yoke are combined with each other by concavo-convex structures.

6. A device for testing insulation properties of a transformer, comprising:
    a low-voltage winding part and a high-voltage winding part arranged concentrically with each other;
    an iron core for testing combined with the low-voltage winding part and the high-voltage winding part, and adjustable in height according to heights of low-voltage winding part and high-voltage winding part, wherein the low-voltage winding part is arranged concentrically around a center iron core of the iron core for testing and the high-voltage winding part is arranged concentrically around the low-voltage winding part;
    a low-voltage terminal part connected to both ends of a winding of the low-voltage winding part;
    a high-voltage terminal part connected to both ends of a winding of the high-voltage winding part;
    wherein:
        the iron core for testing is divided into an upper yoke and a lower yoke, and includes a height adjustment part capable of adjusting a height between the upper yoke and the lower yoke;
        the height adjustment part has a structure vertically divided into a plurality of parts; and
        a height of the iron core for testing is adjustable according to a usage amount of the divided height adjustment parts.

7. The device of claim 6, wherein the upper yoke and the height adjustment part, and the height adjustment part and the lower yoke are combined with each other by concavo-convex structures.

8. The device of claim 6, further comprising an iron core shield part located between a center iron core of the iron core for testing and the low-voltage winding part to adjust a spacing interval between the center iron core and the low-voltage winding part.

9. The device of claim 8, wherein the iron core shield part includes an inner insulating part arranged at a circumference of the center iron core, a shield part located at an outer surface of the inner insulating part, an outer insulating part surrounding the shield part, and a bus bar for electrical connection between the shield part and the iron core for testing.

10. The device of claim 9, wherein the shield part includes metal bars which are vertically elongated, and a diameter of the shield part is adjusted by adjusting the number of metal bars.

11. A device for testing insulation properties of a transformer, comprising:
- an iron core, having a longitudinal axis with an adjustable height, wherein the iron core includes an upper yoke and a lower yoke configured to accept different numbers of height adjustment parts therebetween to modify the adjustable height along the longitudinal axis;
- a low-voltage winding, arranged around the iron core concentrically to the longitudinal axis and between the upper yoke and the lower yoke;
- a high-voltage winding, arranged around the low-voltage winding concentrically to the low-voltage winding and between the upper yoke and the lower yoke;
- a low-voltage terminal connected to a first end and a second end of the low-voltage winding; and
- a high-voltage terminal connected to a first end and a second end of the high-voltage winding.

12. The device of claim 11, wherein in a first state, the upper yoke is directly connected to the lower yoke, and a number of height adjustment parts is zero, and wherein in a second state, the upper yoke is connected to the lower yoke via at least one height adjustment part.

13. The device of claim 11, wherein in a first state, the upper yoke is connected to the lower yoke via at least one height adjustment part, and wherein in a second state, the upper yoke is connected to the lower yoke a greater number of height adjustment parts than in the first state.

14. The device of claim 11, wherein the height adjustment part is vertically divided into a plurality of sub-parts.

15. The device of claim 11, further comprising an iron core shield located between the iron core and the low-voltage winding to adjust a spacing interval between the iron core and the low-voltage winding.

16. The device of claim 15, wherein the iron core shield includes:
- an inner insulator arranged at a circumference of the iron core;
- a shield located at an outer surface of the inner insulator;
- an outer insulator surrounding the shield; and
- a bus bar for electrical connection between the shield and the iron core.

17. The device of claim 16, wherein the shield includes metal bars which are vertically elongated, and a diameter of the shield is adjusted by adjusting the number of metal bars.

* * * * *